(12) United States Patent
Lee et al.

(10) Patent No.: US 7,080,596 B2
(45) Date of Patent: Jul. 25, 2006

(54) MICRO-CASTED SILICON CARBIDE NANO-IMPRINTING STAMP

(75) Inventors: Heon Lee, Sunnyvale, CA (US); Gun-Young Jung, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 175 days.

(21) Appl. No.: 10/794,928

(22) Filed: Mar. 5, 2004

(65) Prior Publication Data
US 2004/0169003 A1    Sep. 2, 2004

Related U.S. Application Data

(62) Division of application No. 10/279,643, filed on Oct. 24, 2002, now Pat. No. 6,755,984.

(51) Int. Cl.
*B82B 1/00* (2006.01)
*B29C 33/38* (2006.01)

(52) U.S. Cl. .................................. 101/28; 977/887
(58) Field of Classification Search ............ None
See application file for complete search history.

(56) References Cited

U.S. PATENT DOCUMENTS 3,973,495 A * 8/1976 Rowe ........................ 101/405
6,309,580 B1 * 10/2001 Chou ........................ 264/338

* cited by examiner

*Primary Examiner*—Daniel J. Colilla

(57) ABSTRACT

A micro-casted silicon carbide nano-imprinting stamp and method of making a micro-casted silicon carbide nano-imprinting stamp are disclosed. A micro-casting technique is used to form a foundation layer and a plurality of nano-sized features connected with the foundation layer. The foundation layer and the nano-sized features are unitary whole that is made entirely from a material comprising silicon carbide (SiC) which is harder than silicon (Si) alone. As a result, the micro-casted silicon carbide nano-imprinting stamp has a longer service lifetime because it can endure several imprinting cycles without wearing out or breaking. The longer service lifetime makes the micro-casted silicon carbide nano-imprinting stamp economically feasible to manufacture as the manufacturing cost can be recouped over the service lifetime.

4 Claims, 18 Drawing Sheets

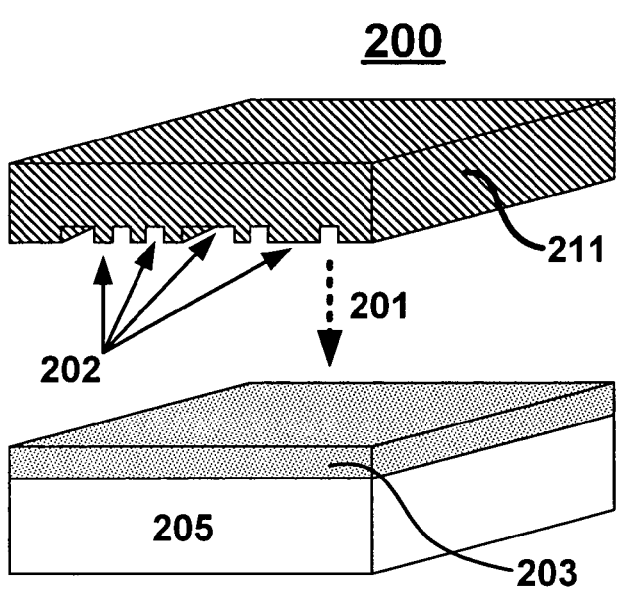
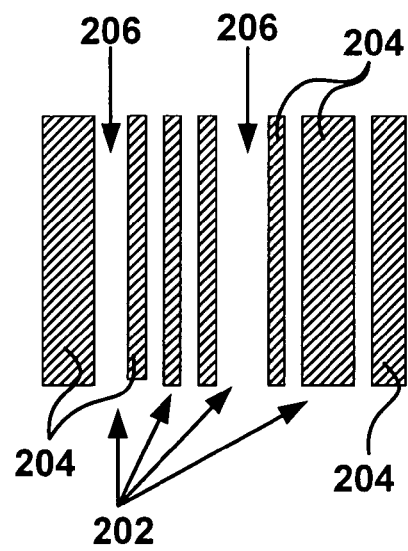
FIG. 1a (Prior Art)
FIG. 1b (Prior Art)
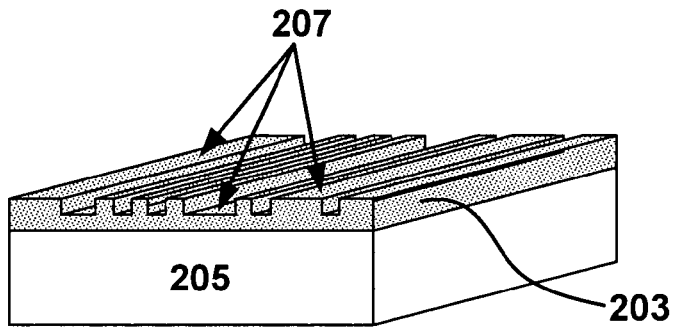
FIG. 2 (Prior Art)
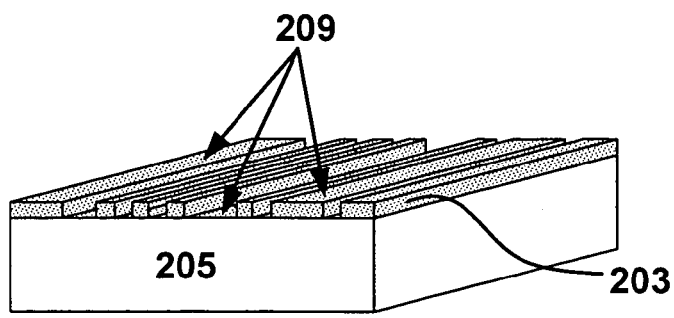
FIG. 3 (Prior Art)

200

200

MICRO-CASTED SILICON CARBIDE NANO-IMPRINTING STAMP

This application is a division of U.S. application Ser. No. 10/279,643, filed Oct. 24, 2002, now U.S. Pat. No. 6,755,984.

FIELD OF THE INVENTION

The present invention relates generally to a structure and a method of forming a hardened nano-imprinting stamp from silicon carbide. More specifically, the present invention relates to a structure and a method of forming a hardened nano-imprinting stamp using a micro-casting process.

BACKGROUND OF THE ART

Nano-imprinting lithography is a promising technique for obtaining nano-size (as small as a few tens of nanometers) patterns. A key step in forming the nano-size patterns is to first form an imprinting stamp that includes a pattern that complements the nano-sized patterns that are to be imprinted by the stamp.

In FIG. 1a, a prior nano-imprint lithography process includes an imprinting stamp 200 having a plurality of imprint patterns 202 formed thereon. In FIG. 1b, the imprint patterns 202 consists of a simple line and space pattern having a plurality of lines 204 separate by a plurality of spaces 206 between adjacent lines 204. The imprint patterns 202 are carried by a substrate 211. By pressing (see dashed arrow 201) the imprinting stamp 200 into a specially designed mask layer 203, a thickness of the mask layer 203 is modulated with respect to the imprint patterns 202 (see FIG. 1a) such that the imprint patterns 202 are replicated in the mask layer 203.

Typically, the mask layer 203 is made from a material such as a polymer. For instance, a photoresist material can be used for the mask layer 203. The mask layer 203 is deposited on a supporting substrate 205. Using a step and repeat process, the imprinting stamp 200 is pressed repeatedly onto the mask layer 203 to replicate the imprint patterns 202 in the mask layer 203 and to cover the whole area of the mask layer 203. In FIG. 2, after the step and repeat process, the mask layer 203 includes a plurality of nano-size impressions 207 that complement the shape of the imprint patterns 202. Next, in FIG. 3, the mask layer 203 is anisotropically etched (i.e. a highly directional etch) to form nano-sized patterns 209 in the mask layer 203. Typically, the supporting substrate 205 or another layer (not shown) positioned between the mask layer 203 and the supporting substrate 205 serves as an etch stop for the anisotropic etch.

In FIG. 4, each line 204 includes opposed side surfaces 204s, a top surface 204t, opposed face surfaces 204f, and edges 204e. A space 206 separates each line 204. Typically, the imprint stamp 200 is made from a material such as silicon (Si). For example, the substrate 211 can be a silicon wafer and the line and space features (204, 206) can be made from silicon (Si) or polysilicon (α-Si). Silicon is the material of choice for nano-imprint stamps because there are well established microelectronics processes for manufacturing silicon based structures and circuits, and because silicon is readily available at a reasonable cost.

However, one of the disadvantages of the prior imprint stamp 200 is that silicon is a soft material and is subject to breakage, damage, and wear from repeated pressing steps into the mask layer 203. In FIG. 4, a section E—E of the line feature 204 is particularly subject to wear, damage, and breakage due to repeated pressing steps. In FIG. 5, an enlarged view of the section E—E of FIG. 4 illustrates that the edges 204e, the top surface 204t, the side surfaces 204s, and the face surfaces 204f are particularly susceptible to wear W from only a few pressing with the mask layer 203.

In FIG. 6, the imprint stamp 200 is pressed 201 into the mask layer 203 so that the line features 204 are disposed in the mask layer 203. Repeated pressing steps cause wear, damage, and breakage denoted as W at the edges 204e and the top surface 204t of the line features 204. Only ten or fewer pressing steps can result in the imprint stamp 200 wearing to the point where it can no longer be used to form consistent, repeatable, and accurate imprint patterns 209.

In FIGS. 7a and 7b, a more detailed view of the wear to the line features 204 shows that the wear is most severe along the edges 204e and top surface 204t as those portions of the line features 204 contact the mask layer 203 first and have surface features that are substantially normal to the direction of pressing 201. Accordingly, as illustrated in FIGS. 8a and 8b, the line feature 204 quickly deteriorates from the ideal line feature 204 of FIG. 8a to the worn out line features 204 of FIG. 8b after only a few pressing cycles with the mask layer 203.

Fabrication of the imprint stamp 200 is one of the most crucial and most expensive steps in the entire imprinting lithography process. Another disadvantage of the prior imprint stamp 200 is that a cost of manufacturing the imprint stamp 200 is not recouped because the imprint stamp 200 is damaged and/or wears out before an adequate number of pressing steps required to justify the manufacturing cost of the imprint stamp 200 can occur. Accordingly, the prior imprint stamp 200 is not economical to manufacture.

Consequently, there exists a need for a nano-size imprinting stamp that is resistant to wear, damage, and breakage. There is also an unmet need for a nano-size imprinting stamp that can retain consistent, repeatable, and accurate imprint patterns over multiple pressing steps so that the cost of manufacturing the nano-size imprinting stamp is recovered.

SUMMARY OF THE INVENTION

The micro-casted silicon carbide nano-imprinting stamp of the present invention solves the aforementioned disadvantages and limitations of the prior nano-imprinting stamps. The micro-casted silicon carbide nano-imprinting stamp of the present invention is stronger and tougher because silicon carbide is used as the material for the imprint stamp as opposed to the silicon material of the prior nano-imprinting stamps.

The micro-casted silicon carbide nano-imprinting stamp of the present invention has an increased service lifetime; therefore, the cost of manufacturing the micro-casted silicon carbide nano-imprinting stamp can be recovered because the stamp can withstand many pressing cycles without wearing out, breaking, or being damaged, unlike the prior nano-imprinting stamps that are made from silicon.

Other aspects and advantages of the present invention will become apparent from the following detailed description, taken in conjunction with the accompanying drawings, illustrating by way of example the principles of the present invention.

BRIEF DESCRIPTION OF THE DRAWINGS

FIGS. 1a and 1b are profile and top plan views respectively of a prior imprint stamp and prior imprint patterns.

FIG. 2 is a profile view of a prior mask layer with nano-size impression formed therein by the prior imprint stamp of FIG. 1a.

FIG. 3 is a profile view of the prior mask layer of FIG. 2 after an anisotropic etch step.

DETAILED DESCRIPTION

Figure 4:
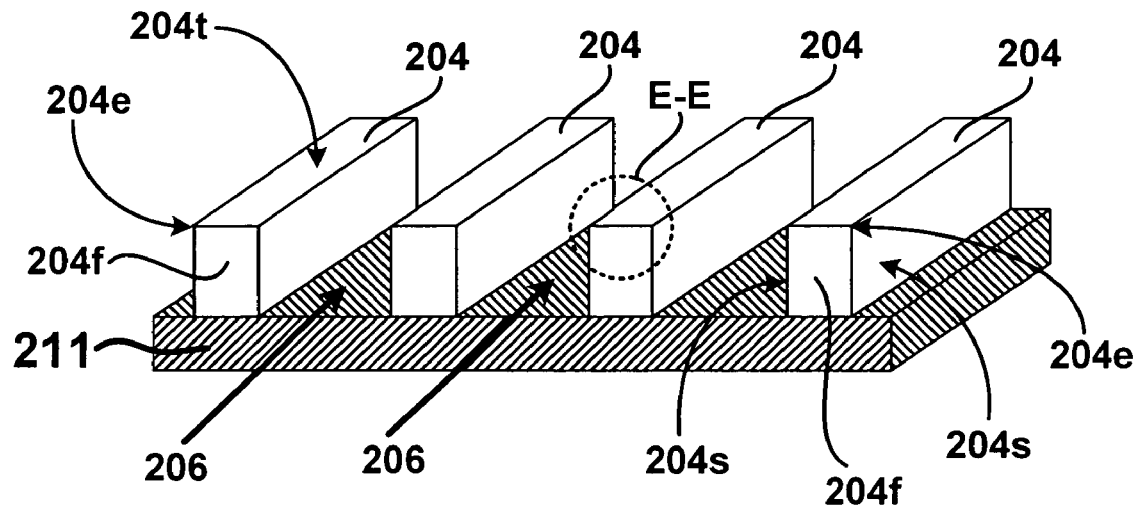
FIG. 4 is a side profile view of a prior imprint stamp being pressed into a mask layer.
Figure 5:
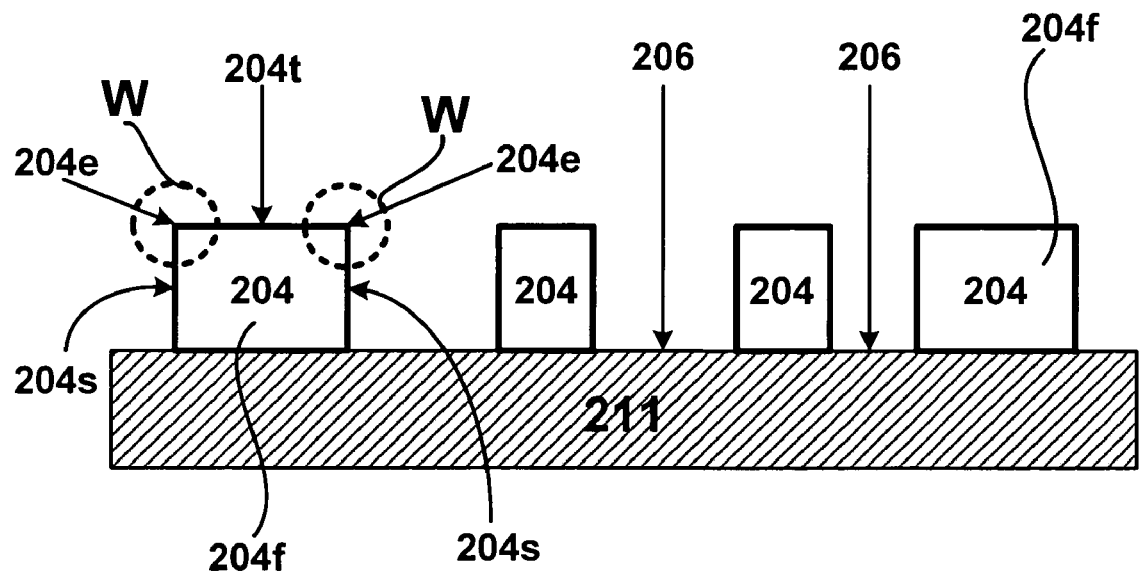
FIG. 5 is a more detailed view depicting portions of a prior imprint stamp that are most susceptible to wear, breakage, or damage.
Figure 6:
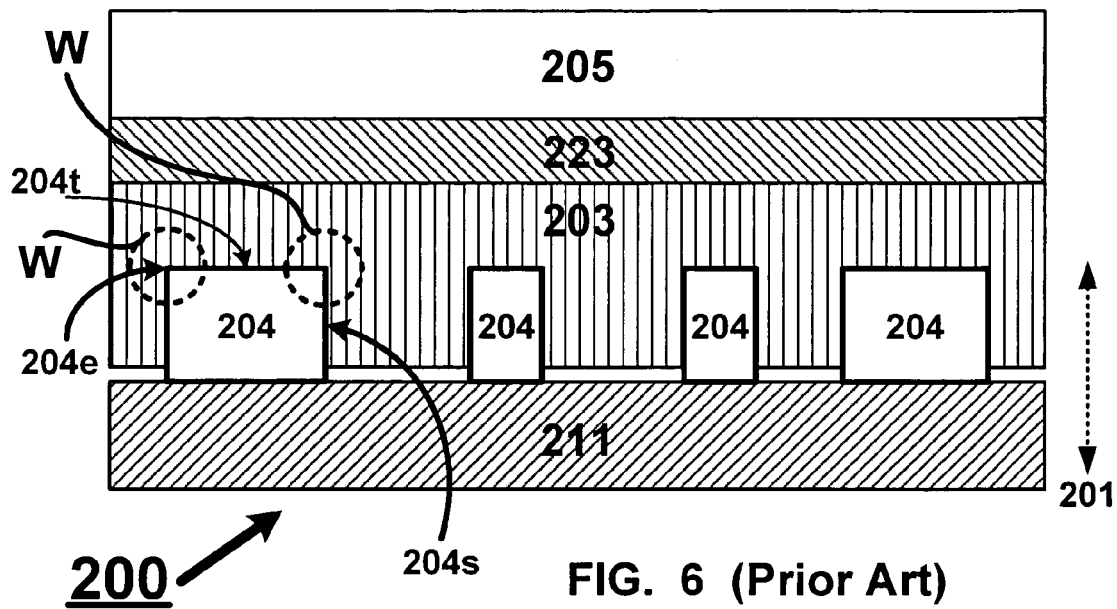
FIG. 6 is a cross-sectional view depicting a prior imprint stamp pressed into a mask layer.
Figures 7A, 7B:
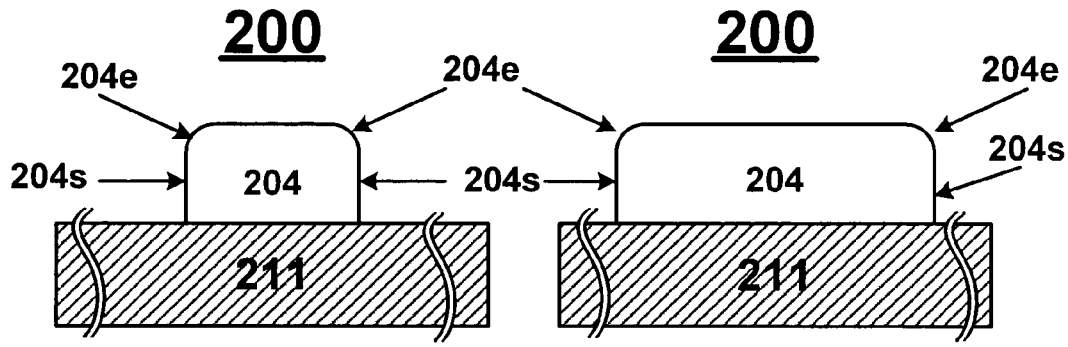
FIGS. 7a and 7b depict wear to the prior imprint stamp resulting from the pressing step of FIG. 6.
Figures 8A, 8B:
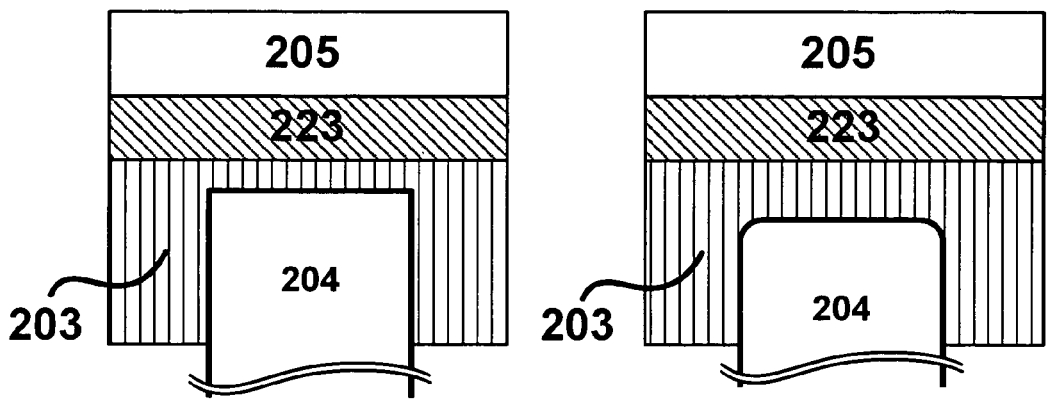
FIGS. 8a and 8b depict the rapid progression of wear to the prior imprint stamp after only a few pressing cycles.

In the following detailed description and in the several figures of the drawings, like elements are identified with like reference numerals.

As shown in the drawings for purpose of illustration, the present invention is embodied in a micro-casted silicon carbide nano-imprinting stamp and a method of micro-casting a silicon carbide nano-imprinting stamp. The micro-casted silicon carbide nano-imprinting stamp includes a handling substrate, a glue layer connected with the handling substrate, and a foundation layer connected with the glue layer and including a base surface and a plurality of nano-sized features that are connected with the foundation layer and extend outward of the base surface. Each nano-sized feature includes an outer surface that defines an imprint profile. The foundation layer and the nano-sized features are made entirely of a material comprising silicon carbide and the foundation layer and the nano-sized features are a micro-casted unitary whole, that is, they are formed as a single piece or unit.

The micro-casted silicon carbide nano-imprinting stamp of the present invention is cost effective because the micro-casted silicon carbide nano-sized features are durable, resilient, and are harder than the silicon nano-sized features of prior nano-imprinting stamps. Therefore, the micro-casted silicon carbide nano-imprinting stamp has a longer service life that allows for the cost of manufacturing the micro-casted silicon carbide nano-imprinting stamp to be recovered before its useful service life has ended.

Additionally, the micro-casted silicon carbide nano-imprinting stamp of the present invention is more accurate than the prior silicon nano-imprinting stamps because the silicon carbide (SiC) nano-sized features are a harder material than is silicon (Si) alone and therefore maintain their imprint profile over repeated pressing steps thereby producing repeatable, consistent, and dimensionally accurate imprints in a media imprinted by the micro-casted silicon carbide nano-imprinting stamp.

Figure 9:
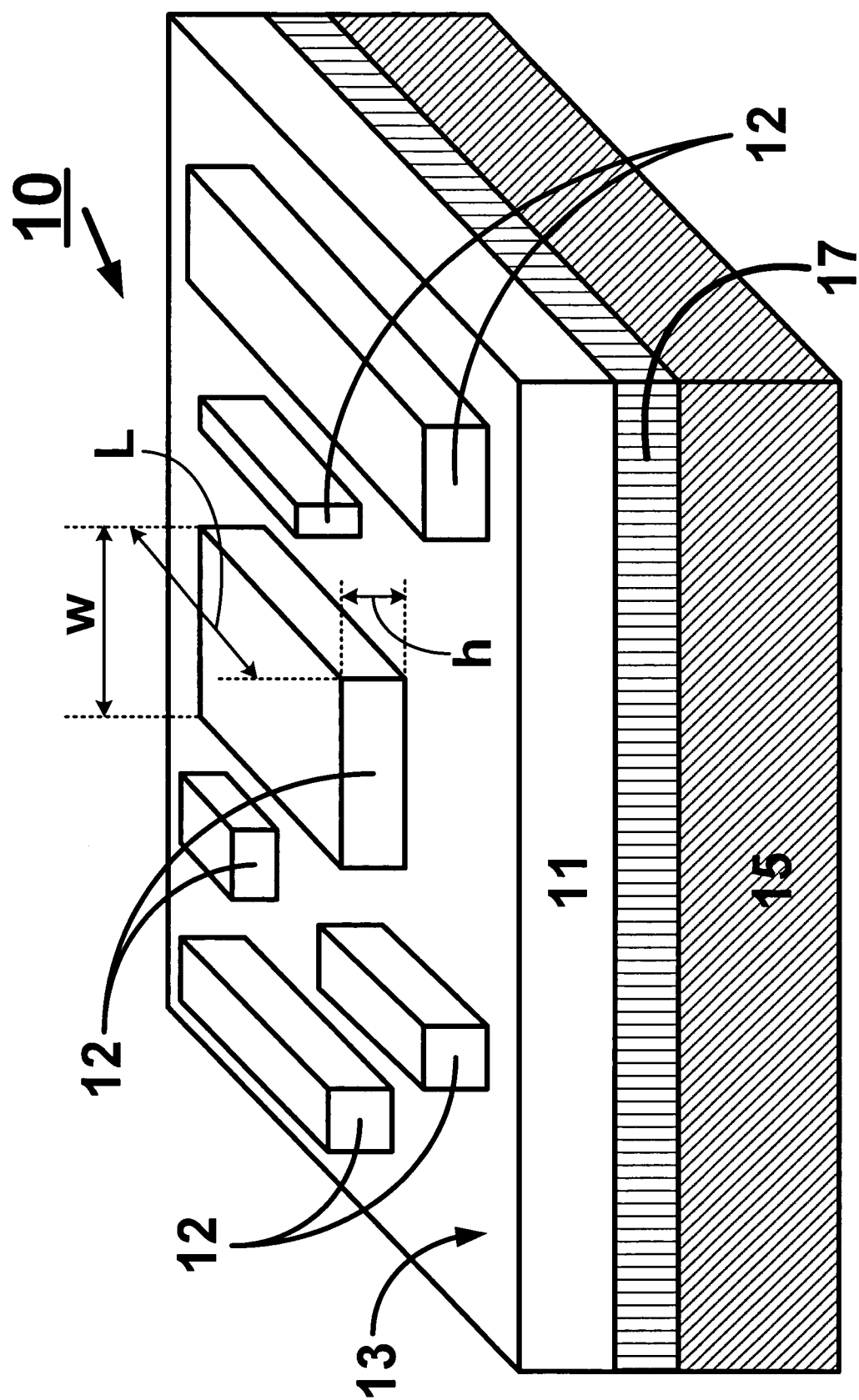
FIG. 9 is a profile view of a of a micro-casted silicon carbide nano-imprinting stamp including a plurality of nano-sized silicon carbide features according to the present invention.

In FIG. 9, a micro-casted silicon carbide nano-imprinting stamp 10 includes a handling substrate 15, a glue layer 17 that is connected with the handling-substrate 15, and a foundation layer 11 that is connected with the glue layer 17. The foundation layer 11 includes a base surface 13 and a plurality of nano-sized features 12 that are connected with the foundation layer 11 and extending outward of the base surface 13. The nano-sized features 12 include an outer surface that defines an imprint profile. The imprint profile can be the same or it can vary among the nano-sized features 12. For instance, the imprint profile can be determined by the dimensions of the nano-sized features 12 such as their respective width W, length L, and height H. Although the nano-sized features 12 are illustrated as having a rectangular imprint profile, the present invention is not to be construed as being limited to the imprint profiles illustrated herein and the imprint profiles need not be rectangular.

Figure 10:
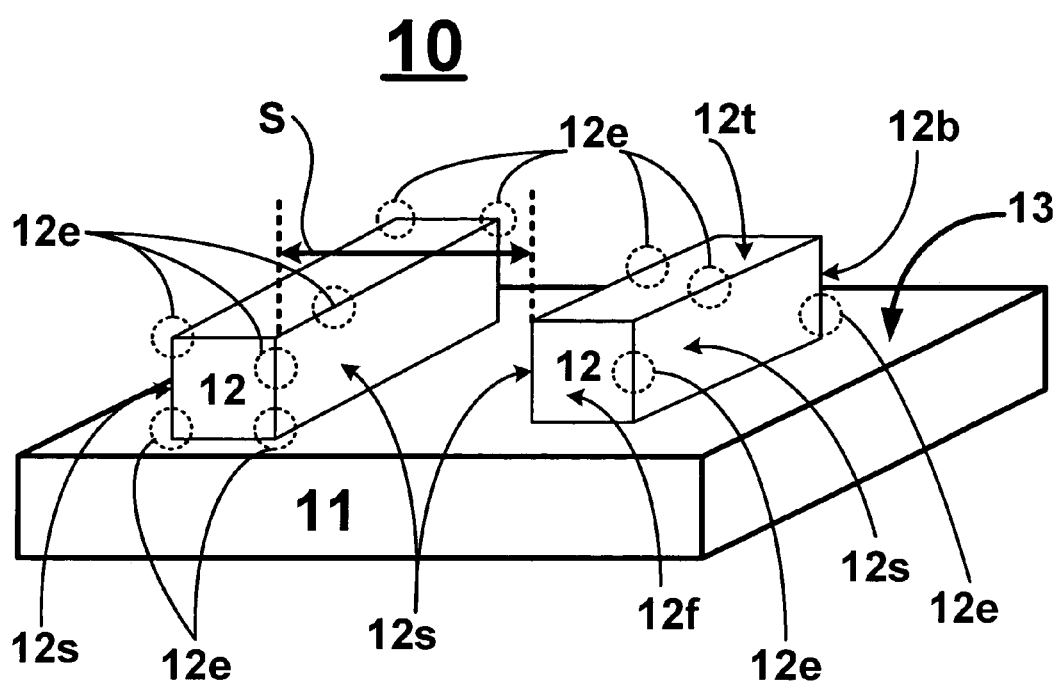
FIG. 10 is a profile view of a silicon carbide foundation layer and a plurality of nano-sized silicon carbide features according to the present invention.

In FIGS. 9 and 10, together with the base surface 13, the nano-sized features 12 define an imprint pattern that is to be transferred into a media (not shown) to be imprinted by the micro-casted silicon carbide nano-imprinting stamp 10. For example, a space S between the nano-sized features 12 can be a part of the imprint pattern such that the nano-sized features 12 and the space S define a line and space pattern that is to be imprinted in the media.

In FIG. 10, for a rectangular or square imprint profile, the outer surface of the nano-sized features 12 includes opposed side surfaces 12s, a top surface 12t, a front surface 12f and back surface 12b, and edges 12e. The nano-sized features 12 may not include the aforementioned surfaces if the imprint profile has a shape other than a rectangular or square shape. The nano-sized features 12 and the foundation layer 11 are a unitary whole. That is, they are a single piece that is formed as a unit from a micro-casting process that will be described below. Both the nano-sized features 12 and the foundation layer 11 are made from a material comprising silicon carbide (SIC). Although the material for the nano-sized features 12 and the foundation layer 11 is primarily silicon carbide, the silicon carbide can include other materials or trace amounts of other materials. For instance, the silicon carbide can include nitrogen (N) atoms as a dopant material.

The handling substrate 15 can be made from a variety of materials including but not limited to a bare silicon wafer, a polysilicon ($\alpha$-Si) coated silicon wafer, a silicon oxide ($SIO_2$) coated silicon wafer, and a silicon nitride ($SI_3N_4$) coated silicon wafer. A silicon wafer is a good choice for the handling substrate 15 because equipment used in microelectronics processing is well suited to handing silicon wafers, silicon wafers are a readily available low cost material, and silicon wafers are an excellent substrate material for wafer bonding processes.

Although a variety of materials can be used for the handling substrate 15, the material selected should be a durable material because the handling substrate 15 must carry the foundation layer 11 and must be able to withstand many imprinting cycles without breaking or warping. Additionally, the handling substrate 15 must be capable of being handled by processing equipment without breaking or damaging the foundation layer 11, the nano-sized features 12, or the base surface 13.

The glue layer 17 can be a material including but not limited to tungsten (W), titanium (Ti), titanium nitride (TIN), cobalt (Co), platinum (Pt), gold (Au), a gold-tin alloy (AuSn), silver (Ag), and a silicide of those metals with the silicon of the handling substrate 15. For example, the glue layer 17 can be a tungsten silicide ($WSi_2$). As will be described below, the glue layer 17 mechanically bonds the foundation layer 11 with the handling wafer 15. When silicon is selected for the handling substrate 15, one of the aforementioned metals can be selected so that at an interface between the glue layer 17 and the handling substrate 15, a silicide bond is formed. Preferably, a wafer bonding process is used to form the bond between the handling substrate 15 and the foundation layer 11 with the glue layer 17 serving as the bonding material.

The actual dimensions of the nano-sized features 12 and the space S between the nano-sized features 12 will be application dependent and can also depend on a lithography limit of a lithography system used for lithographically defining the nano-sized features 12 and the spaces S. However, the dimensions will be less than about 1.0 µm and are more typically of a nanometer scale (i.e. sub 100 nm) and are therefore about 100.0 nm or less.

Figure 11A:
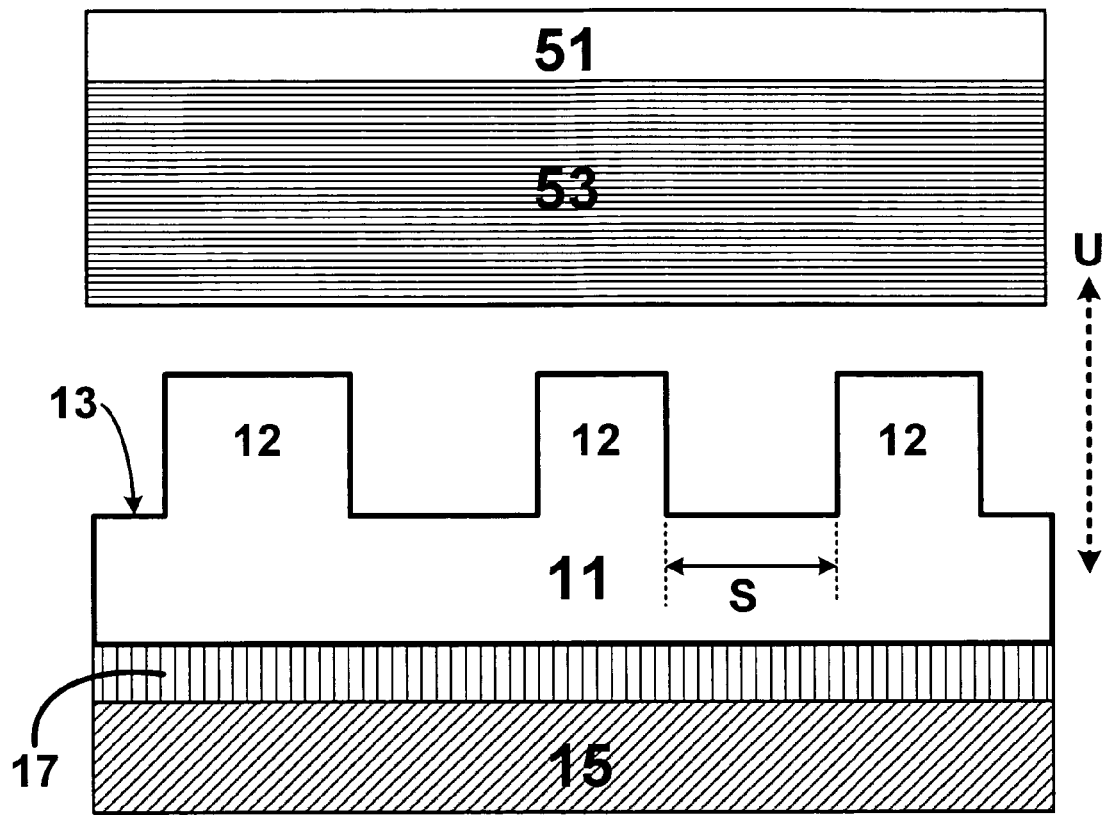
FIGS. 11a and 11b are cross-sectional views that depict an imprinting process using a micro-casted silicon carbide nano-imprinting stamp according to the present invention.

In FIG. 11a, a media 50 to be imprinted by the micro-casted silicon carbide nano-imprinting stamp 10 includes a imprint media 53 carried by a substrate 51. The micro-casted silicon carbide nano-imprinting stamp 10 is urged (see dashed arrow U) into contact with the imprint media 53. For instance the micro-casted silicon carbide nano-imprinting stamp 10 and/or the media 50 can be pressed into contact with each other. The amount of pressure used will be application dependent and will also depend on the material for the imprint media 53. For example, the imprint media 53 can be a polymer material, such as photoresist.

Figure 11B:
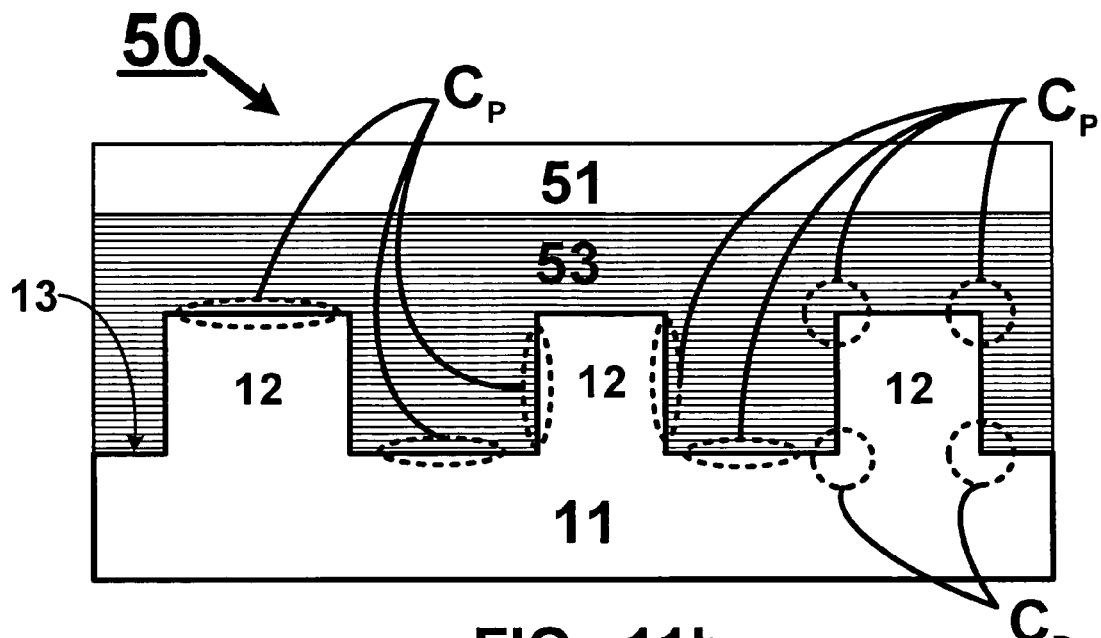

In FIG. 11b, the micro-casted silicon carbide nano-imprinting stamp 10 is depicted already pressed into contact with the imprint media 53. The nano-size features 12 are subject to pressure and wear all along their respective outer surfaces and in particular along various contact points $C_p$, such as the edges 12e, the opposed side surfaces 12s, the top surface 12t, a front surface 12f and back surface 12b, and the base surface 13. During the imprinting process, pressures of about 300 psi to about 500 psi or more are common. Accordingly, the potential for ware, breakage, or damage to the nano-size features 12 is reduced by the harder silicon carbide material of the micro-casted silicon carbide nano-imprinting stamp 10 of the present invention and the nano-size features 12 are therefore more resistant to wear in general and especially along the aforementioned contact points $C_p$.

In FIGS. 12a through 18, a method of micro-casting a silicon carbide nano-imprinting stamp 10 includes forming a release layer 23 on a surface 21s of a substrate 21. The release layer 23 can be deposited using a process including but not limited to chemical vapor deposition (CVD), physical vapor deposition (PVD), and sputtering. The release layer 23 can have a thickness of about several µm or less. The substrate 21 can be a material including but not limited to silicon (Si), single crystal silicon, and a silicon wafer. The release layer 23 can be made from a material including but not limited to those set forth in Table 1 below:

TABLE 1

Materials for the release layer 23

Tetraethylorthosilicate (TEOS)
A Boron (B) doped Tetraethylorthosilicate (BSG)
A Phosphorus (P) doped Tetraethylorthosilicate (PSG)
A Boron (B) and Phosphorus (P) doped Tetraethylorthosilicate (BPSG)
Heavily Doped Polysilicon (α-Si)
Silicon Nitride ($Si_3N_4$)

Figure 12A:
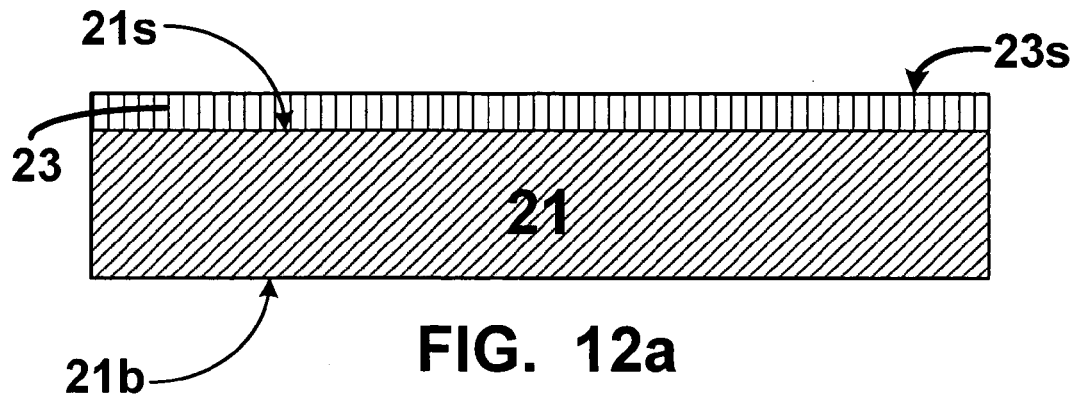
FIGS. 12a through 12c are cross-sectional views that depict a method of forming a micro-casting mold according to the present invention.
Figure 12B:
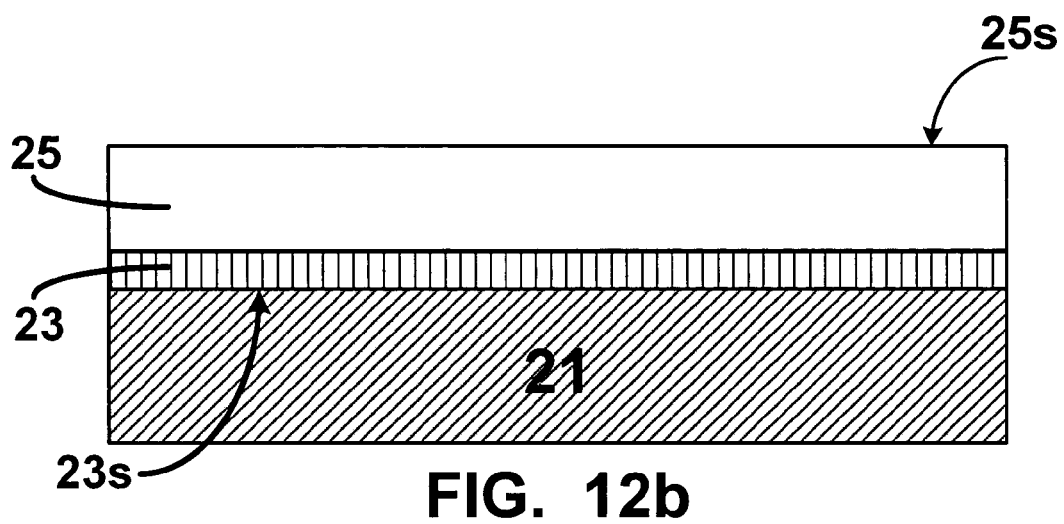

In FIG. 12b, a mold layer 25 is formed on a surface 23s of the release layer 23. The material for the mold layer 25 should be easy to deposit, easy to etch, and capable of being patterned as a nanometer scale feature. Preferably, the mold layer 25 is deposited over a substantially flat substrate or release layer (21, 23) with a uniform deposition rate over the substrate or release layer (21, 23) so that the mold layer 25 is smooth and substantially flat over its surface 25s. The mold layer 25 can be deposited using a process including but not limited to CVD, PVD, and sputtering. Suitable materials for the mold layer 25 include but are not limited to the materials set forth in Table 2 below:

TABLE 2

Materials for the mold layer 25

Silicon Oxide ($SiO_2$)
Silicon Nitride ($Si_3N_4$)
Polysilicon (α-Si)
Crystalline Silicon (Si)

Figure 12C:
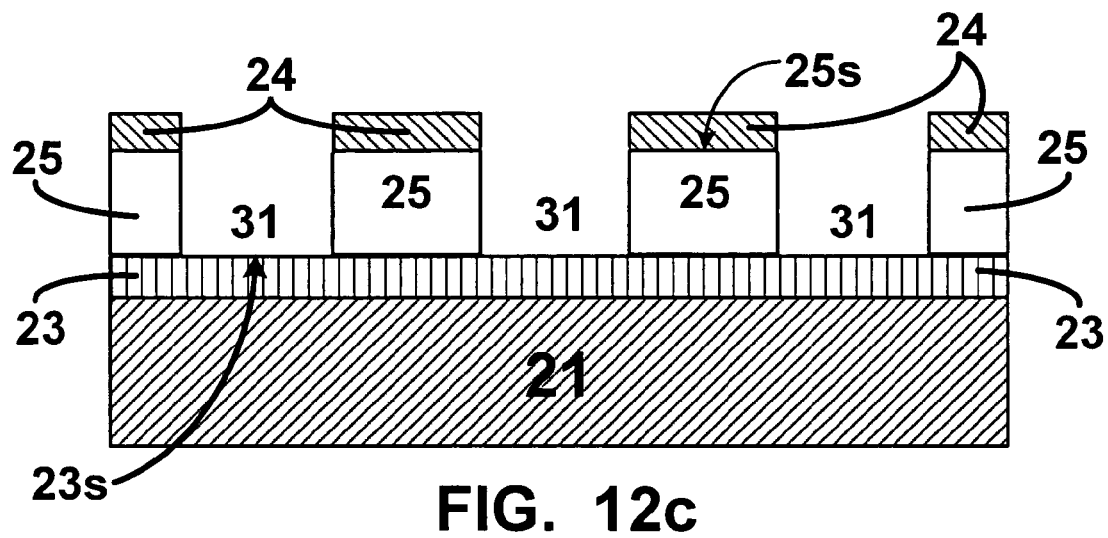

In FIG. 12c, the mold layer 25 is lithographically patterned with a mask 24 and then etched to form a plurality of nano-sized mold cavities 31 that extend all the way to the release layer 23. The material for the release layer 23 can be selected so that the release layer 23 serves as an etch stop for the material used to etch the mold layer 25.

For example, an isotropic etch process, such as reactive ion etching (RIE), can be used to form the nano-sized mold cavities 31. Reactive ion etching is particularly well suited to forming vertical side wall surfaces for the nano-sized mold cavities 31, especially when a desired imprint profile for the nano-sized features 12 that will be formed in the nano-sized mold cavities 31 are to have a rectangular or square imprint profile.

Figure 13:
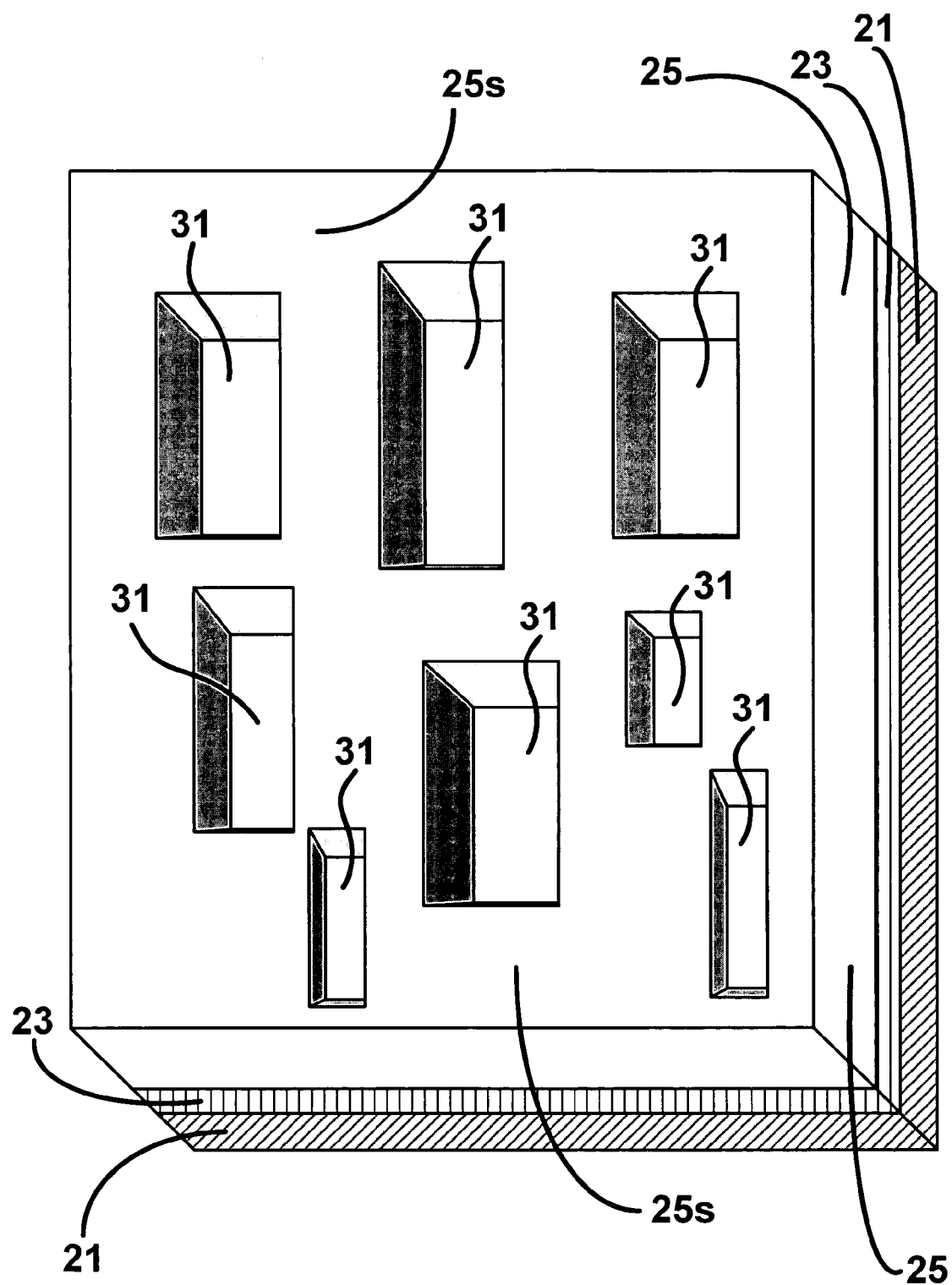
FIG. 13 is a top profile view of a plurality of nano-sized mold cavities according to the present invention.

The patterning of the mold layer 25 can be accomplished using well known microelectronics photolithography processes. For instance, the mask 24 can be a patterned layer of photoresist material. In FIG. 13, the nano-sized mold cavities 31 extend from a top surface 25s of the mold layer to the surface 23s of the release layer 23. The dimensions of the nano-sized mold cavities 31 can be the same or it can vary among the nano-sized mold cavities 31 as illustrated in FIG. 13. The actual dimensions of the nano-sized mold cavities 31 will be application dependent and as stated above for the nano-sized features 12, dimensions of about 1.0 µm or more preferably about 100 nm or less will be typical of the nano-sized mold cavities 31 because the imprint profile of the nano-sized features 12 are determined by the nano-sized mold cavities 31 in which they will be micro-casted.

Figure 14A:
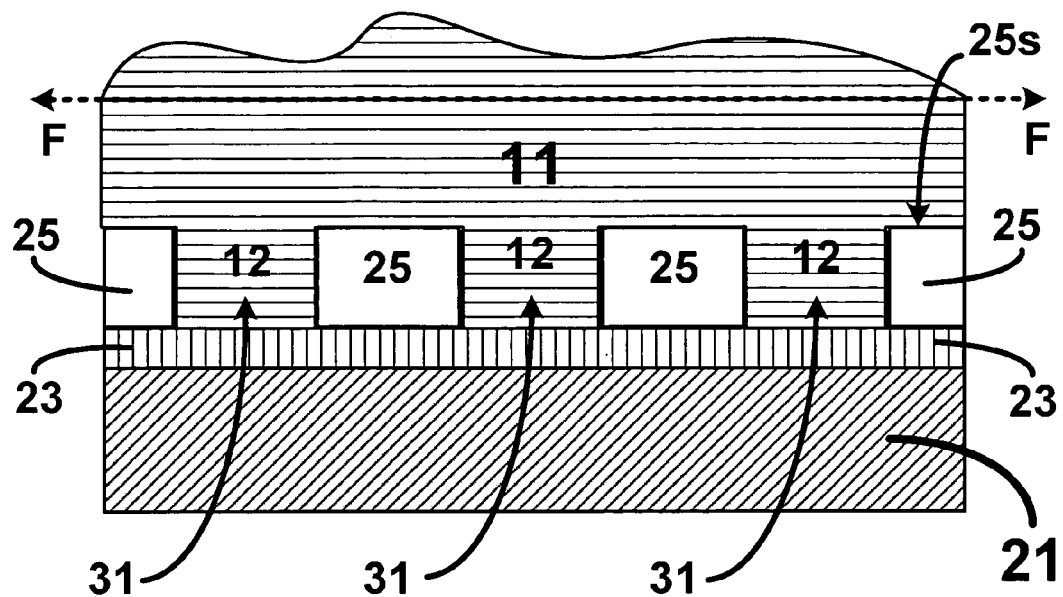
FIGS. 14a and 14b are cross-sectional views that depict a method of micro-casting a silicon carbide nano-imprinting stamp according to the present invention.
Figure 14B:
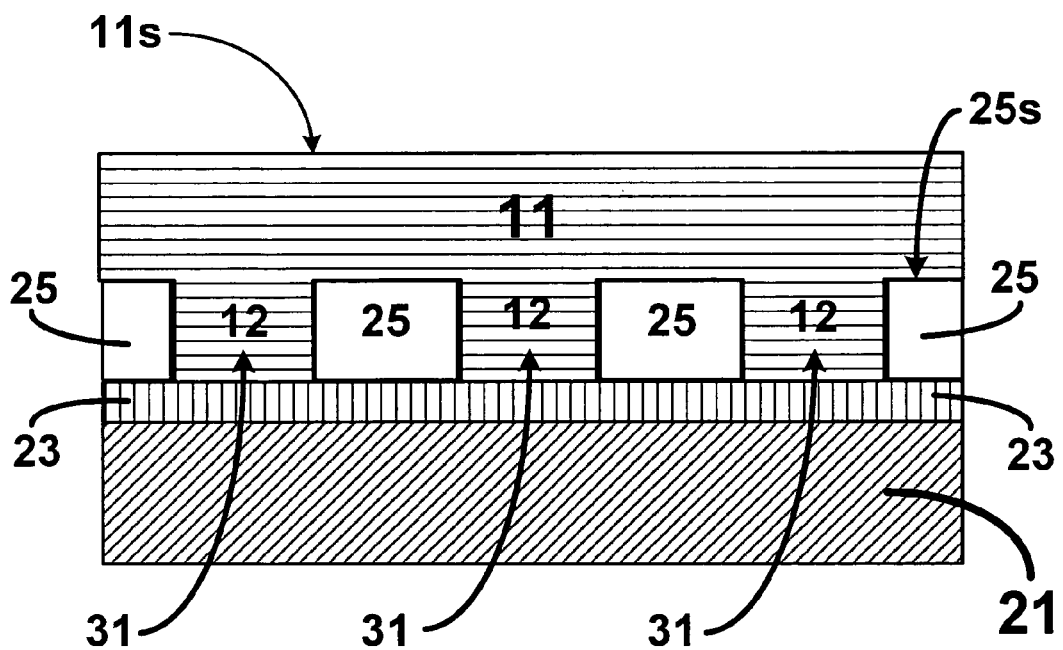

In FIG. 14a, the nano-sized mold cavities 31 are completely filled with a material comprising silicon carbide (SIC). The portion of the silicon carbide that fills the nano-sized mold cavities 31 forms a plurality of the nano-sized features 12; whereas, the remainder of the silicon carbide forms the foundation layer 11 which is connected with the nano-sized features 12. In FIG. 14b, the foundation layer 11 is planarized (see line F—F) to form a substantially planar surface 11s. A process such as chemical mechanical planarization (CMP) can be used to planarize the foundation layer 11 and form the substantially planar surface along the line F—F.

Figure 15:
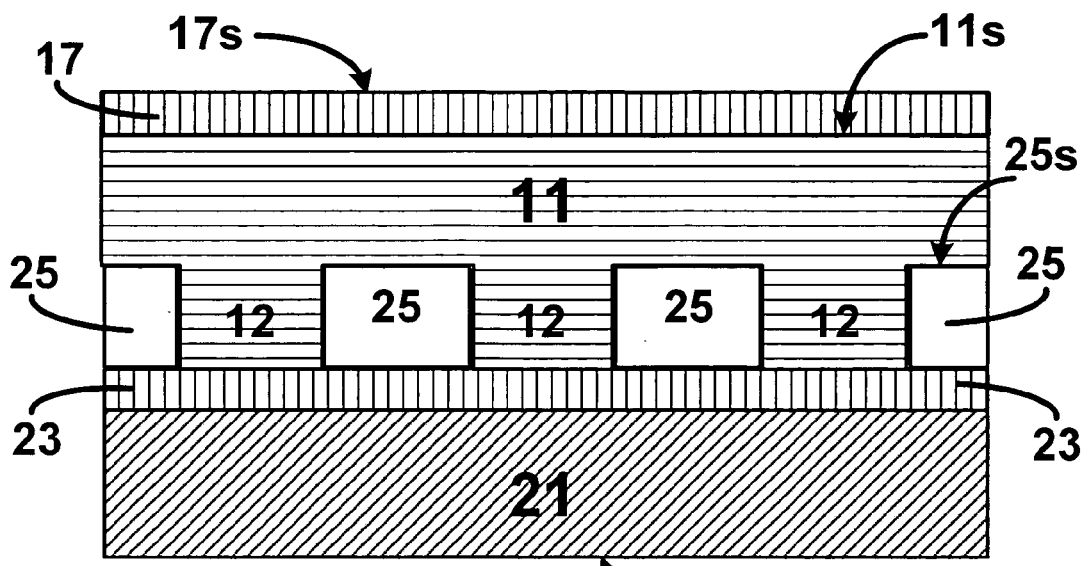
FIGS. 15 through 18 are cross-sectional views that depict a method of extracting a micro-casted silicon carbide nano-imprinting stamp according to the present invention.

In FIG. 15, a glue layer 17 is formed on the planar surface 11s of the foundation layer 11. The glue layer 17 can be deposited using a process including but not limited to CVD, PVD, and sputtering. Suitable materials for the glue layer 17 include but are not limited to the materials set forth in Table 3 below:

TABLE 3

Materials for the glue layer 17

Figure 16A:
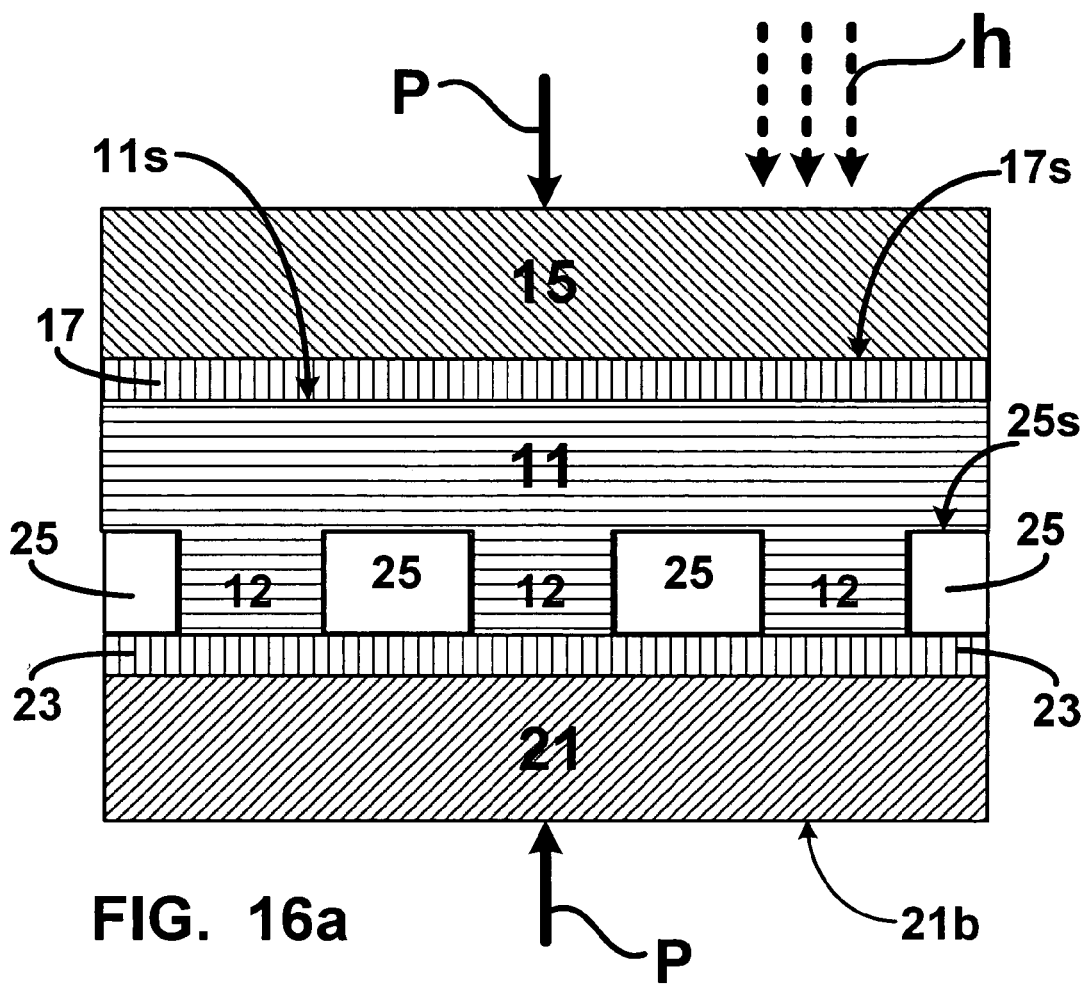

Tungsten (W)
Titanium (Ti)
Titanium Nitride (TiN)
Cobalt (Co)
Platinum (Pt)
Gold (Au)
A Gold-Tin (AuSn) Alloy
Silver (Ag)
A Silicide with the Above Materials In FIG. 16a, a handling substrate 15 is bonded with the glue layer 17 by applying pressure P and heat h to the handling substrate 15 and the substrate layer 21. The heat h and pressure P are continued until the glue layer 17 forms a mechanical bond between the foundation layer 11 and the handling substrate 15. The amount of pressure P and heat h necessary to form the bond will be application dependent and will depend on the materials selected for the foundation layer 11, the glue layer 17, and the handling substrate 15. For example, for a gold-tin (AuSn) alloy wafer bond, the pressure P is about 5,000 lbs over an entire surface of a 4-inch wafer (i.e. ~64 psi) and the heat h applied is about 320° C. As another example, for an oxide-to-oxide wafer bond, the heat h applied is about 1100° C. and the pressure P is about 1 atm (i.e. no added pressure). Suitable materials for the handling substrate 15 are identical to those set forth above in reference to FIGS. 9 and 10.

Figure 16B:
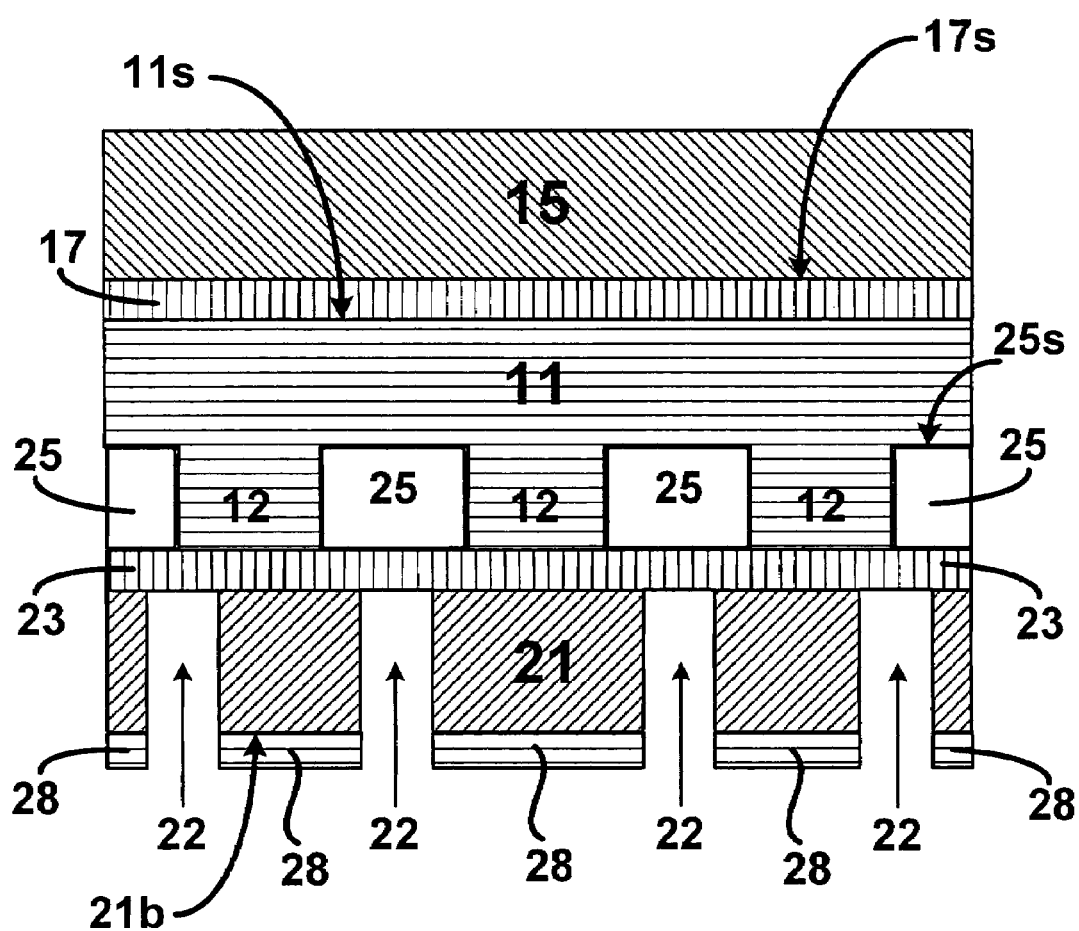

In FIG. 16b, a backside 21b of the substrate layer 21 is lithographically patterned (e.g. through a mask 28) and then etched to form a plurality of through holes 22 that extend to the release layer 23. For instance, a reactive ion etch can be used to form the through holes 22. After the through holes 22 are formed, the substrate layer 21 is released by introducing an etch material into the through holes 22 so that the release layer is etched away thereby releasing the substrate layer 21. A hydrogen fluoride (HF) solution or vapor can be used to etch away the release layer 23. For instance, a hydrogen fluoride etchant will etch a silicon oxide ($SiO_2$) based release layer made from materials such as BSG, BPSG, PSG, and TEOS.

Figure 17:
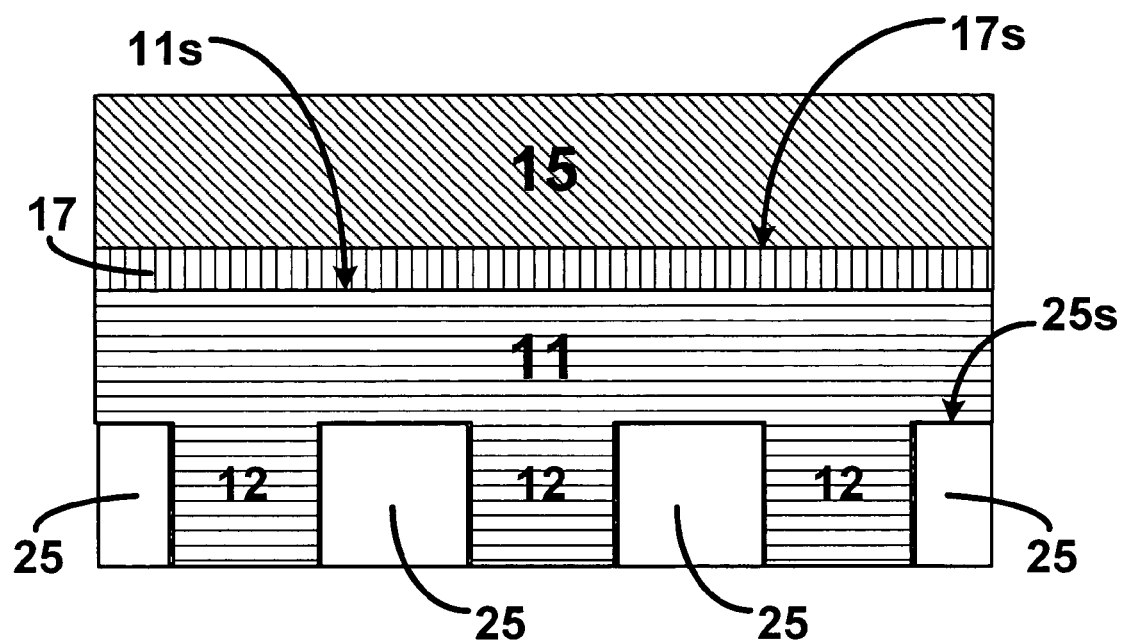

In FIG. 17, the remainder of the mold layer 25 is etched away to remove the mold layer 25 from the nano-sized features 12 and the foundation layer 11. A hydrogen fluoride (HF) solution or vapor can be used to etch away the mold layer 25.

Figure 18:
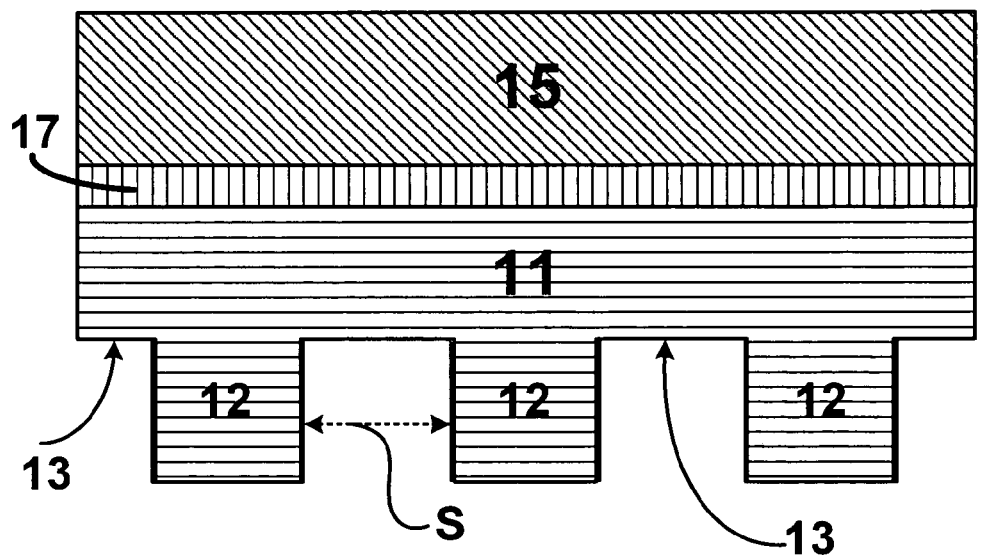

In FIG. 18, after the mold layer 25 is removed, what remains is the micro-casted silicon carbide nano-imprinting stamp 10 of the present invention. The micro-casted silicon carbide nano-imprinting stamp 10 can be used repeatedly to imprint the nano-sized features 12 into an imprint media 53 as was described above in reference to FIGS. 11a and 11b. As a result of the imprinting process, nanometer scale features are imprinted into the imprint media 53 by the nano-sized features 12.

Figure 19A:
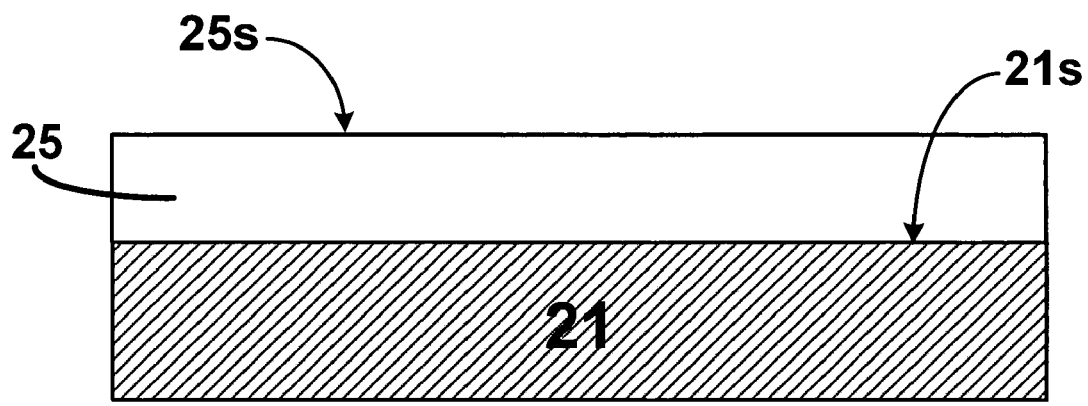
FIGS. 19a through 22 are cross-sectional views that depict an alternative method of forming a micro-casted silicon carbide nano-imprinting stamp according to the present invention.

In one embodiment of the present invention, as illustrated in FIGS. 19a through 22, the aforementioned release layer 23 is dispensed with, and instead, the mold layer 25 is formed directly on the substrate layer 21 as illustrated in FIG. 19a. The material for the mold layer 25 should be easy to deposit, easy to etch, and capable of being patterned as a nanometer scale feature. Preferably, the mold layer 25 is deposited over a substantially flat substrate 21 with a uniform deposition rate over the substrate 21 so that the mold layer 25 is smooth and substantially flat over its surface 25s.

Figure 19B:
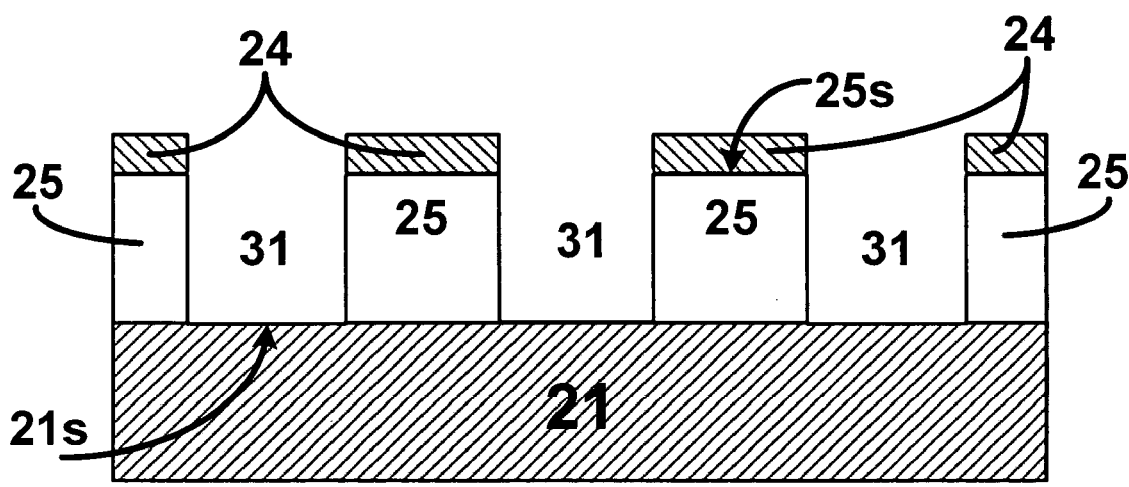

In FIG. 19b, the mold layer 25 is then patterned and etched as was described above to form a plurality of nano-sized mold cavities 31 that extend all the way to the substrate layer 21. The substrate layer 21 can serves as an etch stop for the material used to etch the mold layer 25. The materials for the substrate layer 21 can be the same materials as set forth above and the mold layer 25 can be made from the materials set forth above in reference to Table 2.

Figure 20:
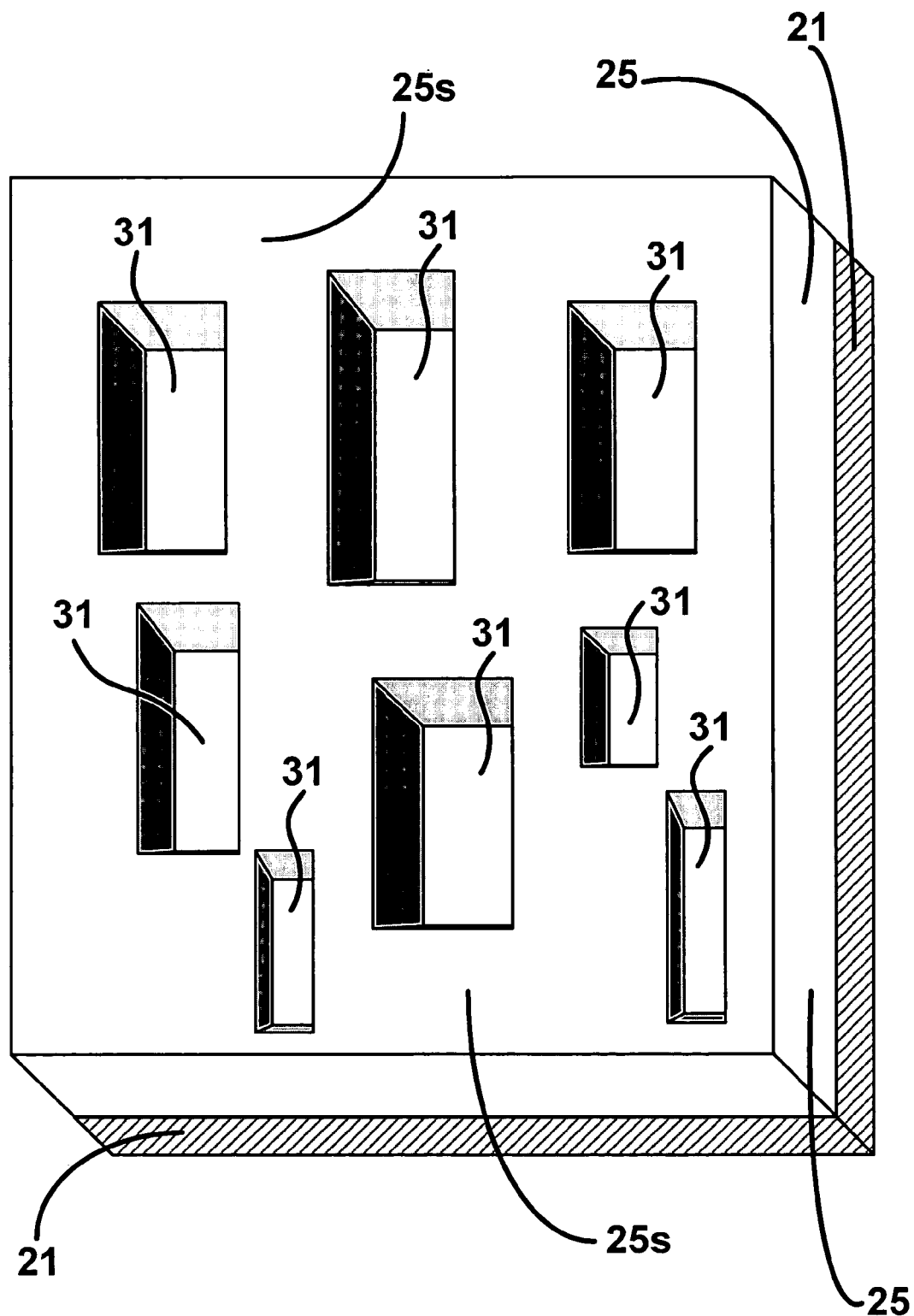
Figure 21:
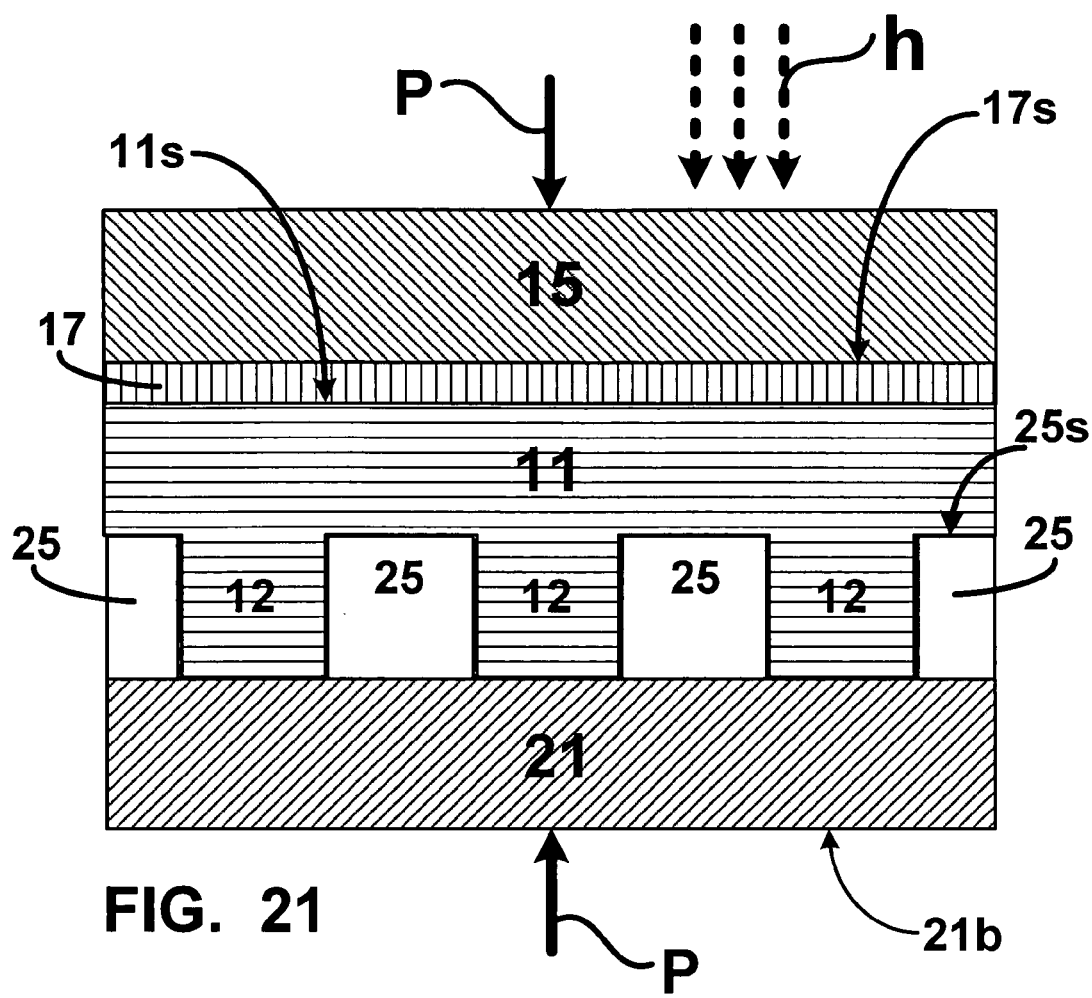

In FIG. 20, the nano-sized mold cavities 31 extend to the substrate layer 21 and can have dimensions that are the same or that can vary among the nano-sized mold cavities 31 as was described above.

In the same manner as was described above in reference to FIGS. 14a through 16, a foundation layer 11 and a plurality of nano-sized features 12 made from a material comprising silicon carbide are formed on the mold layer 25. The foundation layer 11 is planarized and then a glue layer 17 is formed on the planar surface 11s of the foundation layer 11. Next, in FIG. 21, a handling substrate 15 is bonded to the glue layer 17 by applying heat h and pressure P until the handling substrate 15 is mechanically bonded with the glue layer 17. The materials for the glue layer 17 can be the same as set forth above in reference to Table 3.

Figure 22:
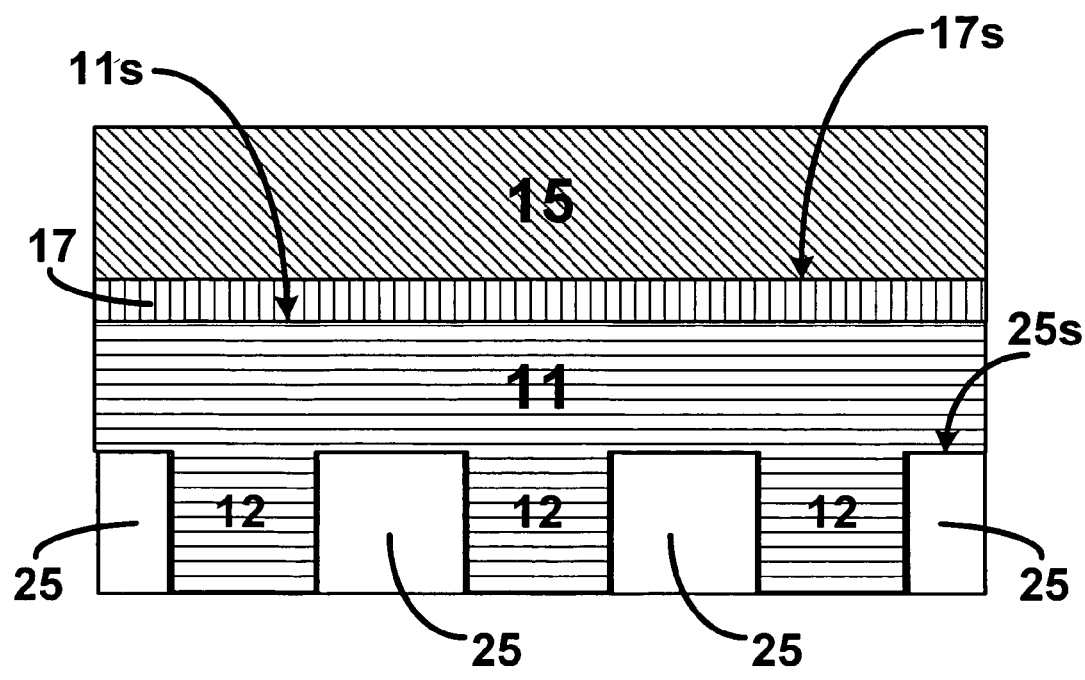

In FIG. 22, the substrate layer 21 can be removed from the mold layer 25 by grinding a backside 21b of the substrate layer 21 until the substrate layer 21 is removed from the mold layer 25. For example, a process such as CMP can be used to grind away the substrate layer 21. Subsequently, the mold layer 25 can be selectively etched away to release the foundation layer 11. A hydrogen fluoride (HF) solution or vapor can be used to etch away the mold layer 25.

Alternatively, the substrate layer 21 can be removed from the mold layer 25 by patterning and then etching the backside 21b of the substrate layer 21 to form a plurality of through holes 22 therein that extend to the mold layer 25 (see FIG. 16). Next, a selective etchant, such as HF, can be introduced into the through holes 22 to etch away the mold layer 25 and thereby releasing the substrate layer 21 and the nano-sized features 12 and the foundation layer 11 as well. In FIG. 18, after the mold layer is removed, what remains is the micro-casted silicon carbide nano-imprinting stamp 10 of the present invention.

Figure 23A:
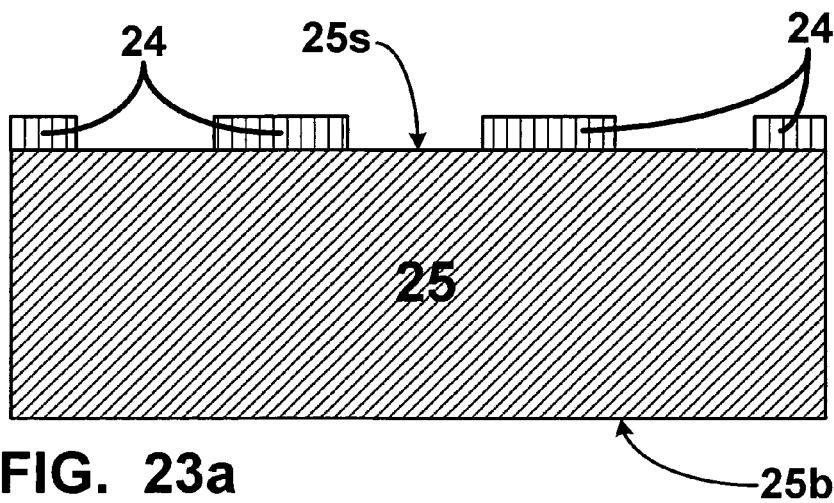
FIGS. 23a through 25b are cross-sectional views that depict yet another method of forming a micro-casted silicon carbide nano-imprinting stamp according to the present invention.
Figure 23B:
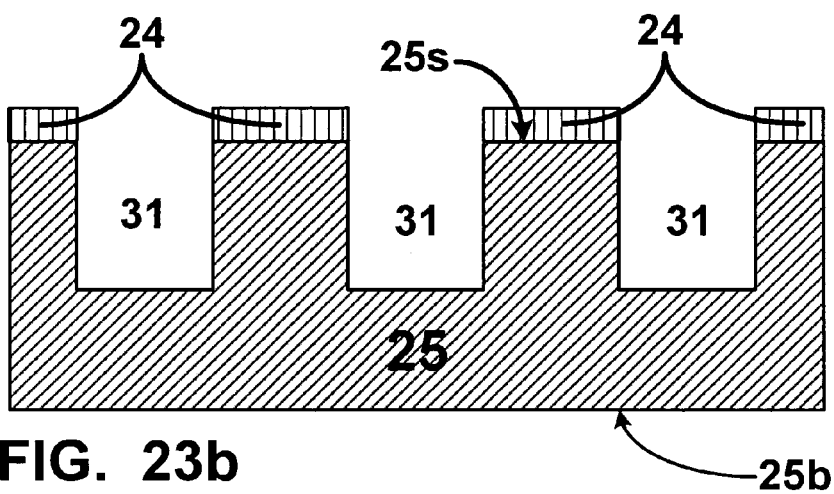

In yet another embodiment of the present invention, as illustrated in FIGS. 23a through 25, a mold layer 25 having a substantially planar surface 25s is patterned 24 (see FIG. 23a) and then etched to form a plurality of nano-sized mold cavities 31 therein (see FIG. 23b). The mold layer 25 can be made from the materials set forth above in reference to Table 2.

Figure 23C:
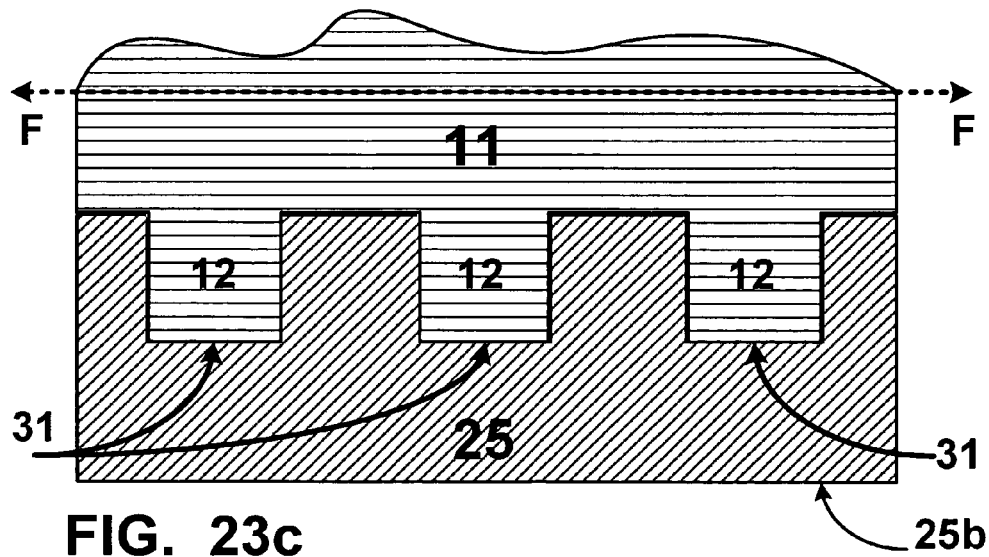
Figure 24:
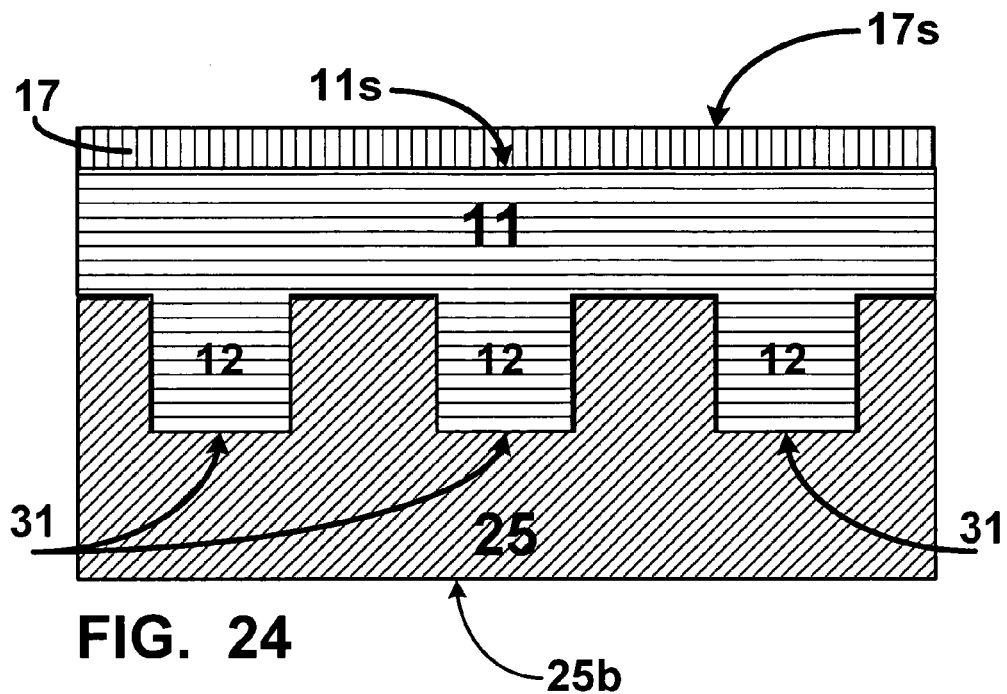
Figure 25A:
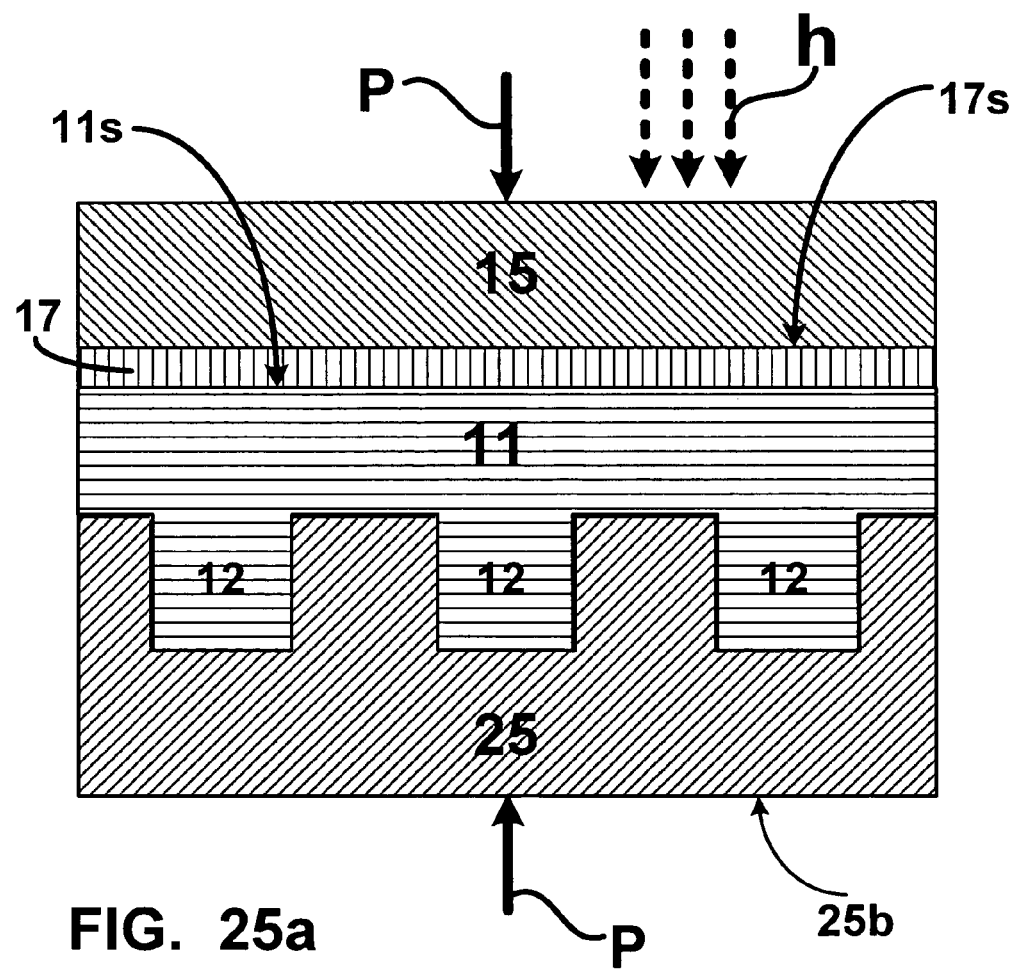
Figure 25B:
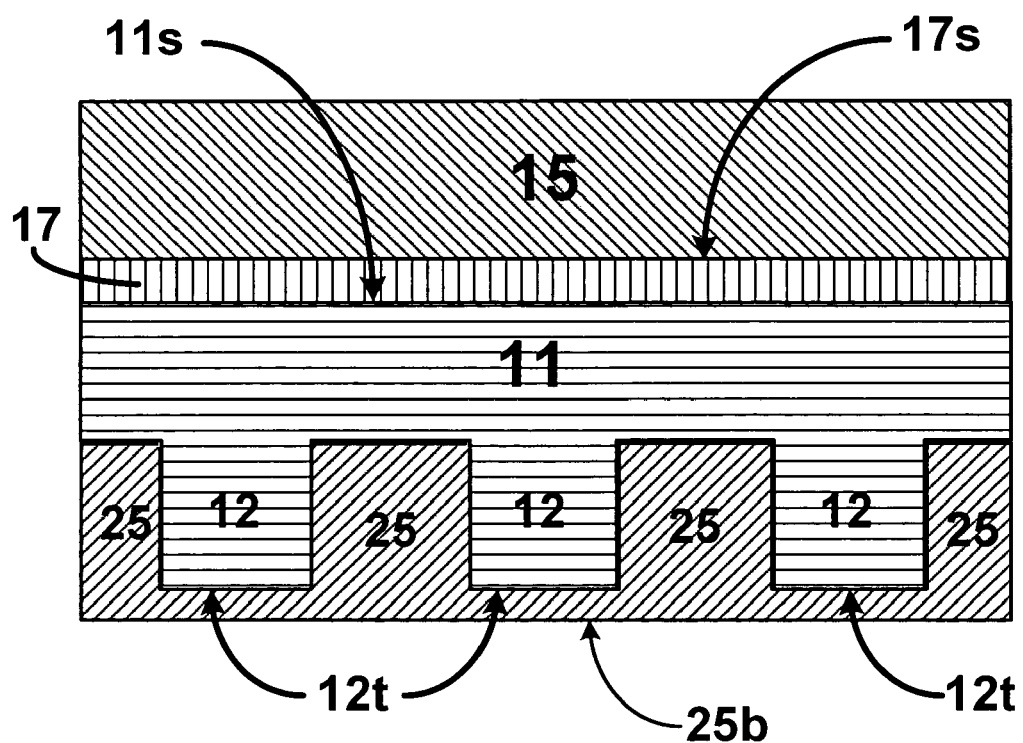

In FIG. 23c, a plurality of nano-sized features 12 and a foundation layer 11 are formed by filling the nano-sized mold cavities 31 with a material comprising silicon carbide as was describe above. The foundation layer 11 is then planarized (see dashed line F—F) to form a substantially planar surface 11s thereon (see FIG. 24). In FIG. 24, a glue layer 17 is formed on the substantially planar surface 11s as was described above. Next, in FIG. 25a, a handling substrate 15 is bonded to the glue layer 17 by applying heat h and pressure P as was also described above. The mold layer 25 can be removed from the foundation layer 11 by selectively etching the mold layer 25 until it is released or dissolved from the foundation layer 11. A selective etch process such as a dry or wet etch can be used to selectively etch the material of the mold layer 25. Alternatively, in FIG. 25b, a backside 25b of the mold layer 25 can be ground (e.g. using CMP) to reduce a thickness of the mold layer 25 such that only a thin layer of the mold layer 25 still covers the top surfaces 12t of the nano-sized features 12. A selective etch process such as reactive ion etching (RIE) can be used to selectively remove the remainder of the mold layer 25 from the foundation layer 11 (see FIG. 18). The materials for the glue layer 17 can be the same as those set forth above in reference to Table 3; whereas, the material for the handling substrate 15 can be the same as set forth above.

Although several embodiments of the present invention have been disclosed and illustrated, the invention is not limited to the specific forms or arrangements of parts so described and illustrated. The invention is only limited by the claims.

What is claimed is:

1. A micro-casted silicon carbide nano-imprinting stamp, comprising:

a handling substrate;

a glue layer connected with the handling substrate, wherein the glue layer comprises a material selected from the group consisting of tungsten, titanium, titanium nitride, cobalt, platinum, gold, a gold-tin alloy, silver, and a silicide;

a foundation layer connected with the glue layer and including a base surface; and a plurality of nano-sized features connected with the foundation layer and extending outward of the base surface, the nano-sized features including an outer surface defining an imprint profile, the foundation layer and the nano-sized features are a micro-casted unitary whole and are made entirely from a material comprising silicon carbide, and wherein a hardness of the silicon carbide is operative to maintain the imprint profile of the nano-sized features over repeated engagements of the nano-imprinting stamp with a media to be imprinted.

2. The micro-casted silicon carbide nano-imprinting stamp of claim 1, wherein the handling substrate is made from a material selected from the group consisting of a bare silicon wafer, a polysilicon coated silicon wafer, a silicon oxide coated silicon wafer, and a silicon nitride coated silicon wafer.

3. The micro-casted silicon carbide nano-imprinting stamp of claim 1, wherein the nano-sized features have a dimension that is less than about 1.0 μm.

4. The micro-casted silicon carbide nano-imprinting stamp of claim 1, wherein the dimension of the nano-sized features is less than about 100.0 nm.

* * * * *